United States Patent
Kajita

(10) Patent No.: US 6,768,902 B1
(45) Date of Patent: Jul. 27, 2004

(54) DOUBLE FREQUENCY CONVERTER MAKING POSSIBLE SHIFTING OF THE FREQUENCIES OF FIRST AND SECOND LOCAL OSCILLATION SIGNALS BY THE SAME FREQUENCY

(75) Inventor: Kazutoyo Kajita, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 568 days.

(21) Appl. No.: 09/627,126

(22) Filed: Jul. 27, 2000

(30) Foreign Application Priority Data

Jul. 29, 1999 (JP) ............................................ 11-214908

(51) Int. Cl.$^7$ ................................................. H04B 1/26
(52) U.S. Cl. ...................... 455/313; 455/314; 455/315; 455/209
(58) Field of Search ........................... 455/62, 313–315, 455/20, 22, 131, 316, 209, 339

(56) References Cited

U.S. PATENT DOCUMENTS

| | | | |
|---|---|---|---|
| 4,575,761 A | | 3/1986 | Carlson et al. |
| 4,581,643 A | | 4/1986 | Carlson |
| 5,097,221 A | | 3/1992 | Miller |
| 5,507,025 A | | 4/1996 | Rodeffer |
| 5,655,047 A | * | 8/1997 | Hyun et al. ..................... 386/10 |
| 5,697,089 A | * | 12/1997 | Lundqvist et al. ........... 455/315 |
| 5,758,276 A | * | 5/1998 | Shirakawa et al. .......... 455/314 |
| 5,930,696 A | * | 7/1999 | Tzuang et al. ............... 455/311 |
| 6,127,962 A | * | 10/2000 | Martinson ..................... 342/20 |
| 6,271,603 B1 | * | 8/2001 | Kajita ........................... 307/43 |
| 6,298,227 B1 | * | 10/2001 | Molnar ....................... 455/323 |
| 6,411,342 B1 | * | 6/2002 | Tatsuta ........................ 348/724 |

FOREIGN PATENT DOCUMENTS

| | | |
|---|---|---|
| EP | 0 527 481 | 2/1993 |
| JP | 6-291787 | 10/1994 |

* cited by examiner

*Primary Examiner*—William Trost
*Assistant Examiner*—Brandon J Miller
(74) *Attorney, Agent, or Firm*—Brinks Hofer Gilson & Lione

(57) ABSTRACT

The bandwidth of the band pass filter is to be kept narrow to prevent C/N deterioration, and yet the video carrier and the audio carrier on the final output channel are to be maintained at the same level even if its center frequency deviates from the design value. A double frequency converter is provided with a first mixer for frequency conversion of input signals with first local oscillation signals into first intermediate frequency signals; a second mixer for frequency conversion of the first intermediate frequency signals into output signals with second local oscillation signals; and a band pass filter disposed between the first mixer and the second mixer, wherein the frequency of the first local oscillation signals and that of the second local oscillation signals can be shifted by the same frequency.

2 Claims, 2 Drawing Sheets

DOUBLE FREQUENCY CONVERTER MAKING POSSIBLE SHIFTING OF THE FREQUENCIES OF FIRST AND SECOND LOCAL OSCILLATION SIGNALS BY THE SAME FREQUENCY

BACKGROUND OF THE INVENTION

1. Field of the Invention

The present invention relates to a double frequency converter for use in television receivers or television signals transmitters in CATV systems and the like to convert the frequency twice.

2. Description of the Related Art

A double frequency converter according to the prior art for use in television signals transmitters in CATV systems, for instance, will be described with reference to FIG. 4.

Intermediate frequency television signals (the frequencies according to the U.S. specifications are 45.75 MHz for video intermediate frequency signals and 41.25 MHz for audio intermediate frequency signals) generated by a modulator (not shown) are entered into a first mixer 22 via an input filter 21. In the first mixer 22, they are mixed with first local oscillation signals entered from a first local oscillator 23 to be frequency-converted into first intermediate frequency signals of approximately 1300 MHz. If the frequency of the first local oscillation signals is 1254.25 MHz, for instance, those of the first intermediate frequency signals will be the respective differences from that, i.e. 1300 MHz for first video intermediate frequency signals Ifp and 1295.5 MHz for first audio intermediate frequency signals Ifs.

The first intermediate frequency signals, after being amplified appropriately, are entered into a band pass filter 24. The band pass filter 24 consists of a dielectric oscillator, designed to have a flat pass band of 4.5 MHz with a center frequency of 1297.75 MHz. The first intermediate frequency signals cleared of unnecessary signals outside the band by the band pass filter 24 are entered into a second mixer 25, wherein they undergo frequency conversion into television signals for use in usual broadcasting. Therefore, their frequency differs with the channel over which they are transmitted. For this reason, a second local oscillation frequency entered from a second local oscillator 26 into the second mixer 25 differs with the channel for which the conversion is to take place, and is controlled by a PLL circuit 27 to be variable between approximately 1350 MHz and 2350 MHz.

If the signals are to be transmitted over channel 2 (having a video carrier of 55.25 MHz and an audio carrier of 59.75 MHz), for instance, the second local oscillation frequency will be 1355.25 MHz, or if transmitted over channel 94 (having a video carrier of 643.25 MHz and an audio carrier frequency of 647.75 MHz), it will be 1943.25 MHz.

Television signals supplied from the second mixer 25, mixed with other television signals, are transmitted via a wide-band output filter 28.

Incidentally, although the band pass filter 24 is designed to have a center frequency F0 of 1297.75 MHz and a bandwidth of 4.5 MHz as represented by a solid line A in FIG. 5, dimensional fluctuations during the manufacturing process may invite a downward deviation of the center frequency f0 as shown by the dotted line B in FIG. 5. Where such a band pass filter is used, transmission will take place with the level of the video intermediate frequency signals Ifp kept down by X(dB) though the level of the first audio intermediate frequency signals Ifs remains unchanged, giving rise to a problem of deteriorated video quality at the receiving end.

Or, in order to avert this problem, it is conceivable to widen the pass band to prevent, even if the center frequency deviates, the levels of the first audio intermediate frequency signals Ifs and of the first video intermediate frequency signals Ifp from dropping, but this would give rise to another problem of C/N deterioration.

In view of these problems, the double frequency converter according to the present invention is intended to keep the bandwidth of the band pass filter narrow to prevent C/N deterioration, and yet to maintain the video carrier and the audio carrier on the final output channel at the same level even if the center frequency deviates from the design value.

SUMMARY OF THE INVENTION

In order to solve the above-noted problems, a double frequency converter according to the present invention is provided with a first mixer for frequency conversion of input signals with first local oscillation signals into first intermediate frequency signals; a second mixer for frequency conversion of the first intermediate frequency signals into output signals with second local oscillation signals; and a band pass filter disposed between the first mixer and the second mixer, wherein the frequency of the first local oscillation signals and the frequency of the second local oscillation signals can be shifted by the same frequency.

A double frequency converter according to the invention may as well be configured so as to alter the frequency of the second local oscillation signals at prescribed intervals, and to shift each frequency during the prescribed intervals.

Alternatively, a double frequency converter according to the invention may also be configured so as to alter the frequency of the first local oscillation signals at prescribed intervals, and to shift each frequency during the prescribed intervals.

Further, a double frequency converter according to the invention may as well be provided with a first PLL circuit for controlling the frequency of the first local oscillation signals; a second PLL circuit for controlling the frequency of the second local oscillation signals; and a microcomputer for supplying the first PLL circuit or the second PLL circuit with first frequency data for altering the frequency of the first local oscillation signals or the second local oscillation signals at the aforementioned prescribed intervals, wherein second frequency data based on the frequency of the deviation between a reference frequency of the first intermediate frequency signals and the center frequency of the band pass filter is stored into the microcomputer, and shifting is accomplished by supplying the second frequency data that has been stored to the first PLL circuit and the second PLL circuit.

In a double frequency converter according to the invention, the first PLL circuit and the second PLL circuit may have minimum step frequencies smaller than the frequency of the prescribed intervals, using, as reference for the second frequency data, a frequency equal to an integral multiple of the minimum step frequency closest to the frequency of the aforementioned deviation.

DETAILED DESCRIPTION OF THE PREFERRED EMBODIMENTS

Figure 1:
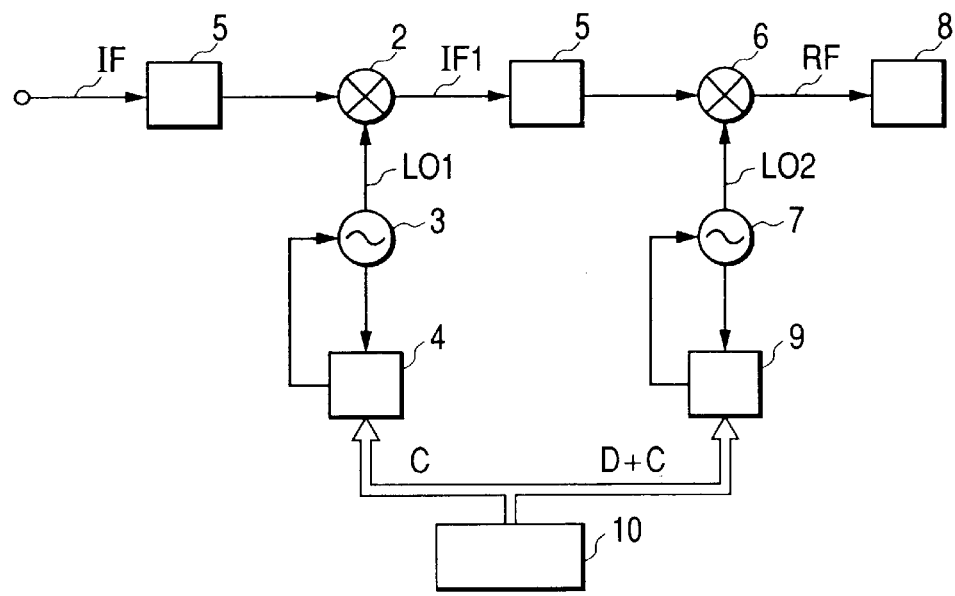
FIG. 1 illustrates the configuration of a double frequency converter, which is a first preferred embodiment of the present invention.
Figure 2:
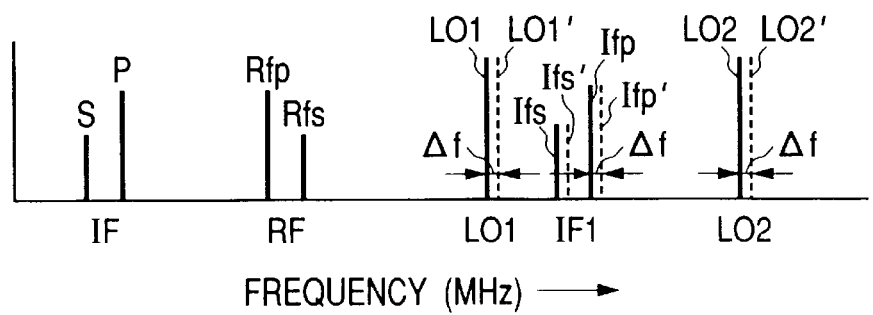
FIG. 2 illustrates the arrangement of frequencies in the double frequency converter, which is the first preferred embodiment of the invention.

Double frequency converters according to the present invention will be described in detail below. FIG. 1 illustrates the configuration of a first preferred embodiment of the invention; FIG. 2 illustrates the arrangement of frequencies in it; and FIG. 3, the configuration of a second preferred embodiment of the invention.

FIG. 1 illustrates the configuration of a double frequency converter for use in television signals transmitters. Intermediate frequency television signals (the frequencies according to the U.S. specifications are 45.75 MHz for video intermediate frequency signals P and 41.25 MHz for audio intermediate frequency signals S) generated by a modulator (not shown) are entered into a first mixer 2 via an input filter 1 as input signals. The input filter 1 consists of a band pass filter, whose pass band is 4.5 MHz. In the first mixer 2, they are mixed with first local oscillation signals LO1 entered from a first local oscillator 3 to be frequency-converted into first intermediate frequency signals IF1 of approximately 1300 MHz, which is the sum of their frequencies. If the frequency Lo1 of the first local oscillation signals LO1 is 1254.25 MHz, for instance, that of the first video intermediate frequency signals Ifp will be 1300 MHz, and that of the first audio intermediate frequency signals Ifs, 1295.5 MHz. The relationship among them is represented by solid lines in FIG. 2.

The first local oscillator 3 is controlled by a first PLL circuit 4 to keep its oscillation frequency Lo1 constant (at 1254.25 MHz).

The first intermediate frequency signals IF1, after being amplified appropriately, are entered into a band pass filter 5. The band pass filter 5 is designed to have a center frequency f0 which is the same as, for instance, the intermediate frequency of 1297.75 MHz between the frequency of the first video intermediate frequency signals Ifp and that of the first audio intermediate frequency signals Ifs, and to have a flat pass band of 4.5 MHz with a center frequency of 1297.75 MHz. The first intermediate frequency signals cleared of unnecessary signals outside the band by the band pass filter 6 are entered into a second mixer 5, wherein they undergo frequency conversion into television signals RF for use in usual broadcasting. Since the frequency of the video carrier Rfp is lower than that of the audio carrier Rfs in the television signals RF, the second local oscillation frequency Lo2 supplied by a second local oscillator 7 is kept higher than the frequency of the first intermediate frequency signals IF1, and output signals consisting of the frequency differences between them are used as the television signals RF. This relationship is shown by solid lines in FIG. 2.

The television signals RF supplied from the second mixer 6, mixed with other television signals, are transmitted via a broad-band output filter 8.

The second local oscillation frequency Lo2, which is determined by the channel for the television signals RF to be transmitted (hereinafter called the output channel), is controlled by the second PLL circuit 9 to be variable within a range of approximately 1350 MHz to 2350 MHz.

Into the second PLL circuit 9 is entered tuning data D for determining the output channel, i.e. first frequency data for determining the second local oscillation frequency Lo2, from a microcomputer 10. The second PLL circuit 9, which can vary the second oscillation frequency Lo2 at, for instance, the minimum step frequency of 0.125 MHz (125 KHz), effects control so that it be varied at 6 MHz intervals on the basis of the tuning data D.

If the output channel is channel 2 (having a video carrier of 55.25 MHz and an audio carrier of 59.75 MHz), for instance, the second local oscillation frequency Lo2 will be 1355.25 MHz; if it is channel 3 (having a video carrier of 61.25 MHz and an audio carrier frequency of 65.75 MHz); it will be 1361.25 MHz; or if it is channel 94 (having a video carrier of 643.25 MHz and an audio carrier frequency of 647.75 MHz), it will be 1943.25 MHz.

Here, the microcomputer 10 has an internal memory (not shown). The transmission characteristics of the band pass filter 5 are checked in advance and, if its center frequency f0 is away from the reference frequency F0, frequency compensation data (second frequency data) C corresponding to that frequency deviation is stored in the internal memory of the microcomputer 10. The frequency compensation data C to be stored in this case is stored, with the minimum step frequency of the second PLL circuit 9 being referenced, in the form of the integral multiple of the minimum step frequency closest to the deviation of the center frequency f0.

If the deviation Δf is equal to 300 KHz, for instance, the frequency compensation data C will correspond to 125×2= 250 KHz.

The frequency compensation data C is entered from the microcomputer 10 into the first PLL circuit 4. Then the first local oscillation frequency Lo1 will be shifted by a frequency (250 KHz) based on the frequency compensation data C to become Lo1', and the first intermediate frequency signals IF1 will also be shifted by the same frequency to become Ifp' and Ifs'. These relationships are shown by dotted lines in FIG. 2. As a result, both the shifted first video intermediate frequency signals Ifp' and the first audio intermediate frequency signals Ifs' can be positioned within the pass band of the band pass filter 5.

On the other hand, the frequency compensation data C is entered from the microcomputer 10 into the second PLL circuit 9 as well, and the second local oscillation frequency Lo2 is shifted by 250 KHz to become Lo2'. However, as the frequency of the first intermediate frequency signals IF1 is shifted by 250 KHz, the difference between them does not change, with the tuning data D added to them, and the television signals RF on the output channel can be conformed to a prescribed frequency.

Figure 3:
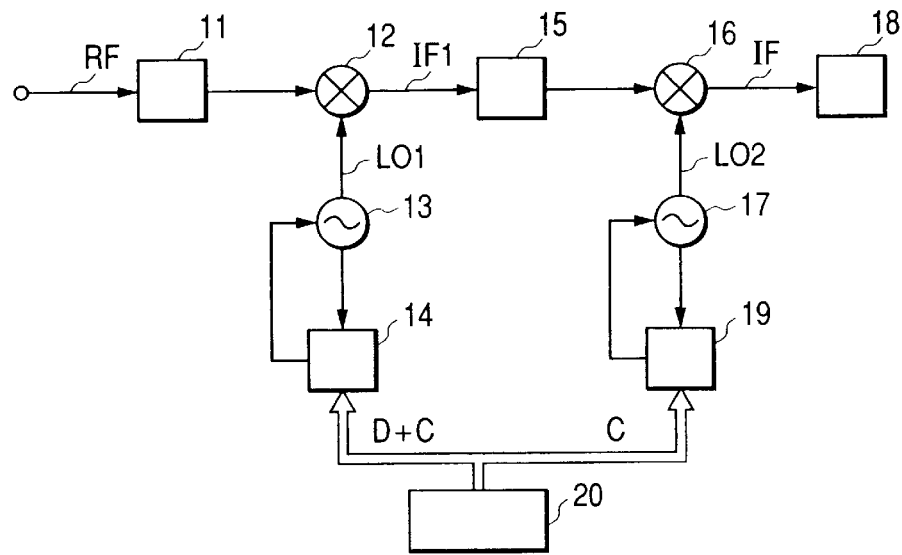
FIG. 3 illustrates the configuration of a double frequency converter, which is a second preferred embodiment of the invention.
Figure 4:
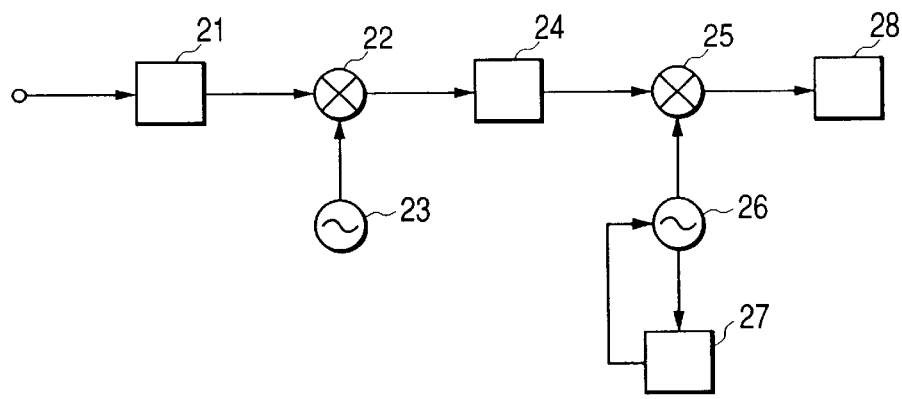
FIG. 4 illustrates the configuration of a double frequency converter according to the prior art.
Figure 5:
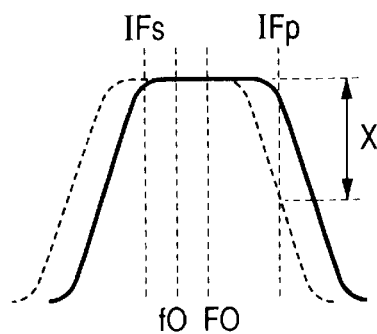
FIG. 5 is a diagram for explaining frequency deviations in the double frequency converter according to the prior art.

Next, the second preferred embodiment of the present invention will be described with reference to FIG. 3. FIG. 3 illustrates a double frequency converter for use in television receivers, which selects specific ones out of many television signals and subjects them to frequency conversion into intermediate frequency television signals IF (the frequencies according to the U.S. specifications are 45.75 MHz for video intermediate frequency signals P and 41.25 MHz for audio intermediate frequency signals S). It has a configuration similar to that illustrated in FIG. 1. Thus, television signals RF, which constitute input signals, are entered into a first mixer 12 via an input filter 11. Into the first mixer 12 are entered first local oscillation signals LO1 from a first local oscillator 13. The first local oscillator 13 is controlled by a first PLL circuit 14, and its frequency Lo1 varies from approximately 1350 MHz to 2350 MHz matching the frequency of the television signals RF. The television signals RF are mixed with the first local oscillation signals LO1, and converted into first intermediate frequency signals IF1, which provide the frequency of difference. The first video intermediate frequency signals Ifp will be 1300 MHz, and the first audio intermediate frequency signals Ifs, 1295.5 MHz, in the first intermediate frequency signals IF1.

The first intermediate frequency signals IF1 pass a band pass filter 15 and are entered into a second mixer 16. The band pass filter 15 is designed to have a center frequency f0 which is the same as, for instance, the intermediate frequency of 1297.75 MHz between the frequency of the first video intermediate frequency signals Ifp and that of the first audio intermediate frequency signals Ifs, and to have a flat pass band of 4.5 MHz. Unnecessary signals outside the band are removed by the band pass filter 15. The first intermediate frequency signals IF1 entered into the second mixer 16 are mixed with second local oscillation signals LO2, which are entered from a second local oscillator 17, and undergo frequency conversion into television intermediate frequency signals RF. These intermediate frequency signals IF become the output signals. Since the frequency of the video intermediate frequency signals P is higher than that of the audio intermediate frequency signals S in the television intermediate frequency signals IF, the second local oscillation frequency Lo2 is kept lower than the frequency of the first intermediate frequency IF1, and signals consisting of the frequency differences between them are used as the intermediate frequency signals IF.

The intermediate frequency signals IF supplied from the second mixer 16 are processed by an intermediate frequency circuit (not shown) in the television receiver via an output filter 18.

Incidentally, the second local oscillator 17, too, is controlled by a second PLL circuit 19 to keep the second local oscillation frequency Lo2 constant.

Here, the first local oscillation frequency Lo1 is determined by the frequency of television signals RF on the channel to be tuned to. For this purpose, tuning data D to determine the reception channel is entered into the first PLL circuit 14 from a microcomputer 20. The first PLL circuit 14, which can vary the first oscillation frequency Lo1 at, for instance, the minimum step frequency of 0.125 MHz (125 KHz), effects control so that it be varied at 6 MHz intervals on the basis of the tuning data D.

Here, the microcomputer 20 has an internal memory (not shown). The transmission characteristics of the band pass filter 15 are checked in advance and, if its center frequency f0 is away from the design value F0, frequency compensation data (second frequency data) C corresponding to that frequency deviation ($\Delta f$) is stored in the internal memory of the microcomputer 20. The frequency compensation data C to be stored in this case is stored, with the minimum step frequency of the first PLL circuit 14 being referenced, in the form of the integral multiple of the minimum step frequency closest to the deviation of the center frequency.

If the deviation $\Delta f$ is 300 KHz for instance, the frequency compensation data C will correspond to 125×2=250 KHz.

The frequency compensation data C, with the tuning data D added to them, is entered from the microcomputer 20 into the first PLL circuit 14. Then the first local oscillation frequency Lo1 will be shifted by 250 KHz based on the frequency compensation data C, and the first intermediate frequency signals IF1 will also be shifted by the same frequency. As a result, both the shifted first video intermediate frequency signals Ifp and the first audio intermediate frequency signals Ifs can be positioned within the pass band of the band pass filter 15.

On the other hand, the frequency compensation data C is entered from the microcomputer 20 to the second PLL circuit 19 as well, and the second local oscillation frequency Lo2 is shifted by 250 KHz. However, as the frequency of the first intermediate frequency signals IF1 is shifted by 250 KHz, the difference between them does not change, and the intermediate frequency signals IF can be conformed to a prescribed frequency.

As hitherto described, the double frequency converter according to the present invention is provided with a first mixer for frequency conversion of input signals with first local oscillation signals into first intermediate frequency signals; a second mixer for frequency conversion of the first intermediate frequency signals into output signals with second local oscillation signals; and a band pass filter disposed between the first mixer and the second mixer, wherein the frequency of the first local oscillation signals and that of the second local oscillation signals can be shifted by the same frequency, and accordingly the band of the intermediate frequency signals can be positioned within the pass band of the band pass filter even if the center frequency of the band pass filter deviates from the reference frequency of the first intermediate frequency signal.

Also, a double frequency converter according to the invention may be configured so as to alter the frequency of the second local oscillation signals at prescribed intervals, and to shift each frequency during the prescribed intervals, with the result that, where it is used in a television signals transmitter, frequency characteristics of video signals between the video intermediate frequency and the audio intermediate frequency can be flattened.

Or, a double frequency converter according to the invention may also be configured so as to alter the frequency of the first local oscillation signals at prescribed intervals, and to shift each frequency during the prescribed intervals, so that, where it is used in a television receiver, frequency characteristics of video signals between the video intermediate frequency and the audio intermediate frequency of the television intermediate frequency signals can be flattened.

Further, a double frequency converter according to the invention may as well be provided with a first PLL circuit for controlling the frequency of the first local oscillation signals; a second PLL circuit for controlling the frequency of the second local oscillation signals; and a microcomputer for supplying the first PLL circuit or the second PLL circuit with first frequency data for altering the frequency of the first local oscillation signals or of the second local oscillation signals at prescribed intervals, wherein second frequency data based on the frequency of the deviation between a reference frequency of the first intermediate frequency signals and the center frequency of the band pass filter is stored into the microcomputer, and shifting is accomplished by supplying the stored second frequency data to the first PLL circuit and the second PLL circuit, with the result that the frequency of the first intermediate frequency signals can be automatically conformed to that of the band pass filter.

In a double frequency converter according to the invention, the first PLL circuit and the second PLL circuit may have minimum step frequencies smaller than the frequency of the prescribed intervals, using as reference for the second frequency data, a frequency equal to an integral multiple of the minimum step frequency closest to the frequency of the aforementioned deviation, so that the frequency can be automatically shifted on the basis of the frequency resolution of the PLL circuits that are used.

What is claimed is:

1. A double frequency converter comprising:

a first mixer to frequency convert input signals with first local oscillation signals into first intermediate frequency signals;

a second mixer to frequency convert the first intermediate frequency signals into output signals with second local oscillation signals;

a band pass filter disposed between the first mixer and the second mixer;

a first PLL circuit to control the frequency of the first local oscillation signals;

a second PLL circuit to control the frequency of the second local oscillation signals;

and a microcomputer to supply one of the first PLL circuit and the second PLL circuit with first frequency data to alter one at the frequency of the first local oscillation signals and the frequency of the second local oscillation signals at the prescribed intervals; and wherein a frequency of the first local oscillation signals and a frequency of the second local oscillation signals are shifted by the same frequency, the frequency of the first local oscillation signals and the frequency of the second local oscillation signals are alterable by prescribed intervals, and each frequency is shiftable by the prescribed intervals, wherein second frequency data based on the frequency of a deviation between a reference frequency of the first intermediate frequency signals and a center frequency of the band pass filter is stored in the microcomputer, and shifting is accomplished by supplying the second frequency data that has been stored to the first PLL circuit and the second PLL circuit.

2. The double frequency converter, according to claim 1, characterized in that the first PLL circuit and the second PLL circuit have minimum step frequencies smaller than the frequency of the prescribed intervals, using, as reference for the second frequency data, a frequency equal to an integral multiple of the minimum step frequency closest to the frequency of the deviation.

* * * * *